US007615912B2

(12) United States Patent
Van Tol et al.

(10) Patent No.: US 7,615,912 B2
(45) Date of Patent: Nov. 10, 2009

(54) ACOUSTIC TRANSDUCER

(75) Inventors: David J. Van Tol, State College, PA (US); Richard J. Meyer, Jr., State College, PA (US)

(73) Assignee: The Penn State Research Foundation, University Park, PA (US)

( * ) Notice: Subject to any disclaimer, the term of this patent is extended or adjusted under 35 U.S.C. 154(b) by 0 days.

(21) Appl. No.: 12/141,658

(22) Filed: Jun. 18, 2008

(65) Prior Publication Data

US 2008/0309198 A1 Dec. 18, 2008

Related U.S. Application Data

(60) Provisional application No. 60/944,651, filed on Jun. 18, 2007.

(51) Int. Cl.
*H01L 41/08* (2006.01)

(52) U.S. Cl. ........................ 310/333; 310/334; 310/358

(58) Field of Classification Search ............. 310/323 R, 310/325, 337
See application file for complete search history.

(56) References Cited

U.S. PATENT DOCUMENTS

| | | | |
|---|---|---|---|
| 4,072,871 | A | 2/1978 | Wilson |
| 4,991,152 | A | 2/1991 | Letiche et al. |
| 5,130,953 | A | 7/1992 | Grosso et al. |
| 5,761,156 | A | 6/1998 | Reuter et al. |
| 6,571,443 | B2 | 6/2003 | Lally et al. |
| 6,848,155 | B2 | 2/2005 | Kuratani et al. |
| 2007/0290579 | A1 | 12/2007 | Han |

FOREIGN PATENT DOCUMENTS

| | | |
|---|---|---|
| JP | 3250897 | 11/1991 |
| JP | 08-033097 | 2/1996 |

OTHER PUBLICATIONS

Pengdi Han et al.; Cut Directions For The Optimization of Piezoelectric Coefficients of Lead Magnesium Niobate-Lead Titanate Ferroelectric Crystals; Applied Physics Letters 86; (2005); pp. 052902-1-052902-3.

*Primary Examiner*—Mark Budd
(74) *Attorney, Agent, or Firm*—Glifford, Krass, Sprinkle, Anderson & Citkowski, P.C.

(57) ABSTRACT

An electroacoustic transducer having a tail mass, a head mass and at least two parallelepiped shaped piezoelectric material elements disposed between and attached to the tail mass and the head mass is provided. The tail mass has a body extending between a first end and a second end, the body having a cavity with a cavity wall and the cavity extending from the first end towards the second end. The head mass has a head and an elongated shaft attached to and extending from the head, the shaft having a shaft axis and being located at least partially within the cavity of the tail mass. The at least two parallelepiped shaped piezoelectric material elements are made from a piezoelectric material having a non-zero $d_{3y}$ shear piezoelectric coefficient where the $d_{3y}$ coefficient can be $d_{34}$, $d_{35}$ or $d_{36}$.

20 Claims, 4 Drawing Sheets

ACOUSTIC TRANSDUCER

CROSS-REFERENCE TO RELATED APPLICATIONS

This application claims priority of U.S. Provisional Patent Application Ser. No. 60/944,651 filed Jun. 18, 2007, which is incorporated herein by reference.

FIELD OF THE INVENTION

The present invention relates to an electroacoustic transducer, in particular to an electroacoustic transducer having a high coupling coefficient and broadband response.

BACKGROUND OF THE INVENTION

A transducer is used to convert electrical energy to sound energy and vice versa. The properties of single crystal piezoelectric materials provide promise for excellent performance when used in transducers. However, small devices operating at low frequency with high output power require large displacements of the radiating surfaces, and compact low frequency transducers typically employ novel mechanical systems to generate additional displacement. In addition, some applications demand compromise between the compliance required to generate large displacements and the stiffness required to withstand hydrostatic pressure.

Heretofore low frequency transducers often exhibit very low coupling coefficients and present highly reactive loads to a system power amplifier as a result of the aforementioned mechanical systems. A reactive load requires the power amplifier to be larger and draw more power than desired. Therefore, an improved transducer exhibiting a relatively high coupling coefficient, broadband response, and can be supported to to withstand hydrostatic pressure in a compact form would be desirable.

SUMMARY OF THE INVENTION

An electroacoustic transducer having a tail mass, a head mass and at least two parallelepiped shaped piezoelectric material elements disposed between and attached to the tail mass and the head mass is provided. The tail mass has a body extending between a first end and a second end, the body having a cavity with a cavity wall and the cavity extending from the first end towards the second end. The head mass has a head and an elongated shaft attached to and extending from the head, the shaft being located at least partially within the cavity of the tail mass. The at least two parallelepiped shaped piezoelectric material elements are made from a piezoelectric material having a non-zero $d_{3y}$ shear piezoelectric coefficient where the $d_{3y}$ coefficient can be $d_{34}$, $d_{35}$ or $d_{36}$. The piezoelectric material elements each have a shaft surface adjacent the shaft, an oppositely disposed cavity surface adjacent the cavity wall, a head surface proximate to and facing the head of the head mass and an oppositely disposed tail surface. In addition, a pair of oppositely disposed face surfaces extend between the shaft surface to the cavity surface and from the head surface to the tail surface, the pair of face surfaces having electrodes in electrical contact therewith.

DETAILED DESCRIPTION OF THE PRESENT INVENTION

Figure 1:
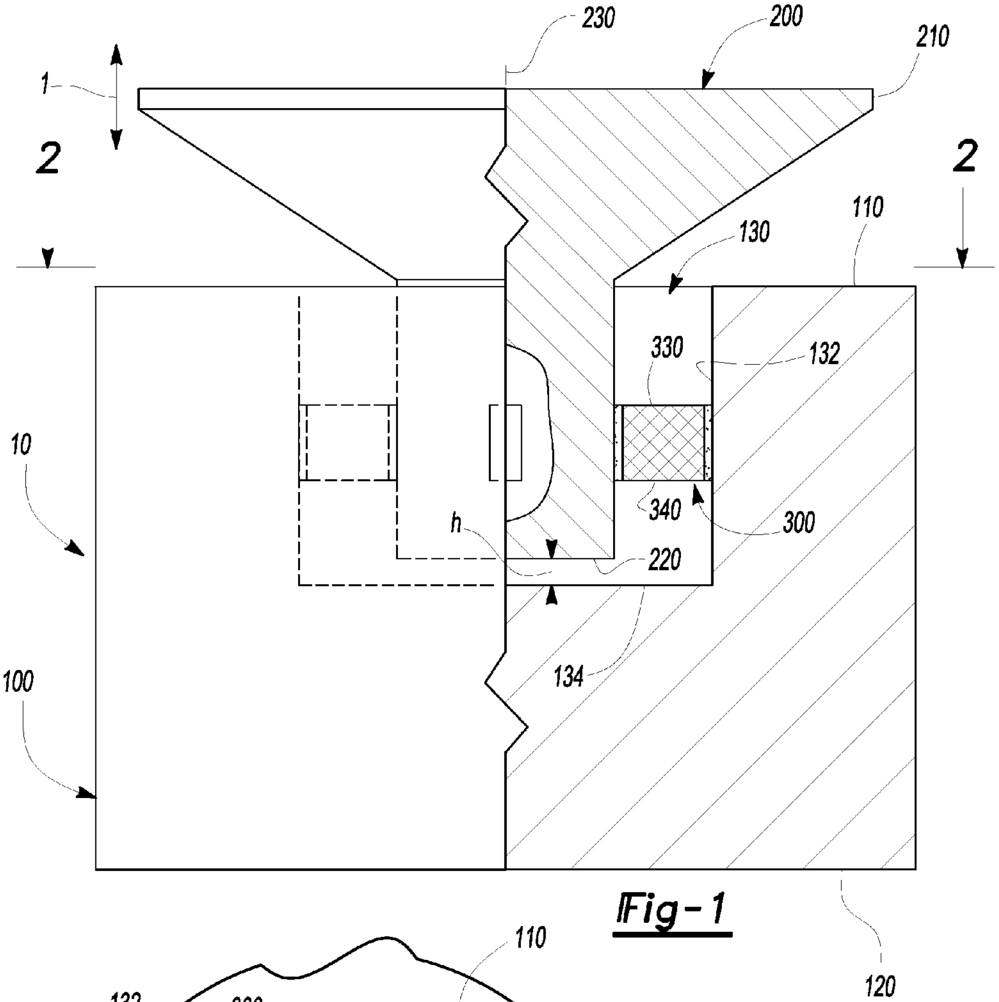
FIG. 1 is a side view showing a partial cross-section of an embodiment of the present invention.
Figure 2:
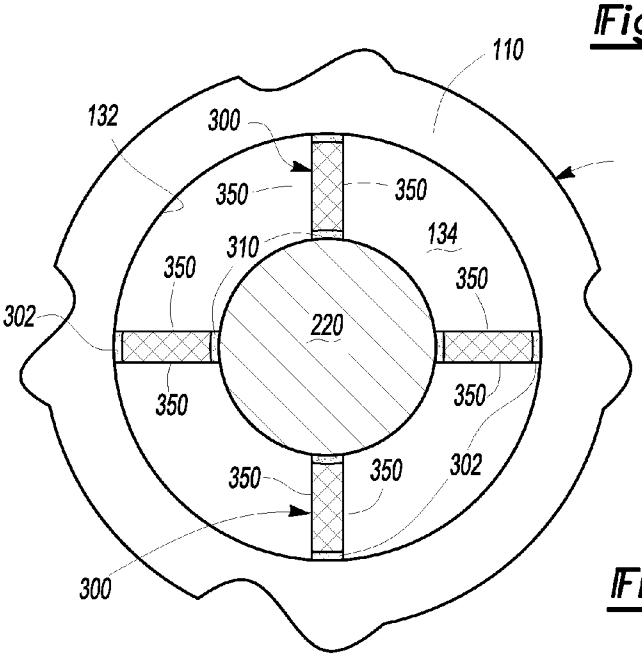
FIG. 2 is a sectional view of the section 2-2 labeled in FIG. 1.
Figure 3:
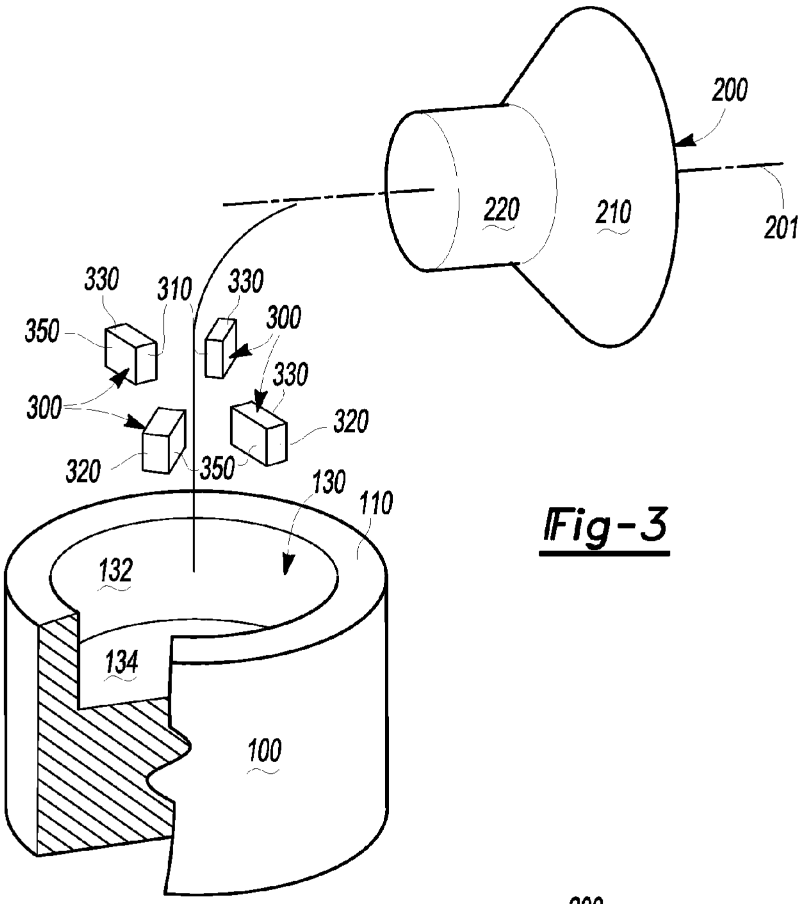
FIG. 3 is an exploded view of the embodiment shown in FIG. 1.
Figure 4:
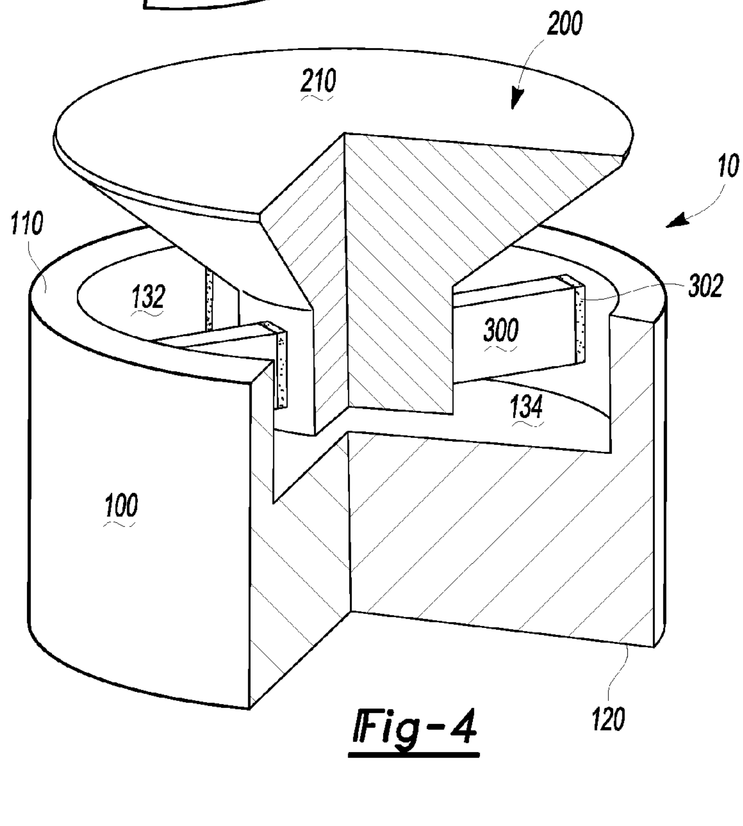
FIG. 4 is a partial cutaway view of the embodiment shown in FIG. 1.

The present invention provides a transducer made from piezoelectric materials. As such, the present invention has utility as a transducer.

In some instances, the transducer is made from lead magnesium niobate-lead titanate (PMN-PT) and/or lead zinc niobate-lead titanate (PZN-PT) piezoelectric materials. The piezoelectric material can be a single crystal, or in the alternative the piezoelectric material is not a single crystal. The transducer provides a relatively high coupling coefficient, compact volume, and can be mounted in such a way that it is insensitive to hydrostatic pressure.

The electroacoustic transducer can include a tail mass, a head mass, and at least two parallelepiped shaped piezoelectric material elements disposed between and attached to the tail mass and the head mass. The tail mass can have a body extending between a first end and a second end, the body having a cavity with a cavity wall and the cavity extending from the first end towards the second end. In some instances, the tail mass is made from a material having a density of greater than 7 grams per cubic centimeter (g/$cm^3$). In other instances, the tail mass is made from a material having a density of greater than 8.5 g/$cm^3$, while in still yet other instances a material having a density of greater than 10 g/$cm^3$. In addition, the tail mass can have a mass that is generally equal to a mass of the head mass, at least 2 times greater than the mass of the head mass, at least 5 times greater than the head mass, at least 10 times greater than the head mass or at least 20 times greater than the head mass. The cavity within the tail mass can extend from the first end to a location that is spaced apart from the second end, or in the alternative can extend completely from the first end to the second end, The head mass has a head and an elongated shaft attached to and extending from the head. The shaft is located at least partially within the cavity of the tail mass. In addition, the shaft can have at least one shaft piezoelectric material element disposed between a first shaft portion and a second shaft portion with activation of the element affording the head mass to move along a shaft axis. Although not required, the at least one shaft piezoelectric material element can have a frequency range that is not the same or equal to a frequency range of the at least two parallelepiped shaped piezoelectric material elements disposed between and attached to the tail mass and the head mass.

The at least two parallelepiped shaped piezoelectric material elements can be made from a piezoelectric material having a non-zero $d_{3y}$ shear piezoelectric coefficient where the $d_{3y}$ coefficient can be $d_{34}$, $d_{35}$ or $d_{36}$, i.e. 'y' can be equal to 4, 5 or 6. In some instances, the $d_{36}$ shear piezoelectric coefficient can be greater than 2000 picocoulombs per Newton while in other instances the $d_{36}$ shear piezoelectric coefficient can be greater than 2400 picocoulombs per Newton. In addition, the elements each have a shaft surface adjacent to the shaft, an oppositely disposed cavity surface adjacent to the cavity wall, a head surface that is proximate to and faces the head portion of the head mass and an oppositely disposed tail surface. Extending between the shaft surface and the cavity surface of the elements is a pair of oppositely disposed face surfaces.

The piezoelectric material elements can be polarized in different directions depending on which $d_{3y}$ shear piezoelectric coefficient is non-zero. For example, if a piezoelectric material element exhibits a non-zero $d_{34}$ or $d_{35}$ shear piezoelectric coefficient, then the element can be polarized in a direction that is parallel to the shaft and cavity surfaces and extends from the head surface to the tail surface, and a first electrode can be in electrical contact with the head surface and a second electrode can be in electrical contact with the tail surface. In the alternative, the non-zero $d_{34}$ or $d_{35}$ piezoelectric material element can be polarized in a direction that is parallel to the head and tail surfaces and extends from the shaft surface to the cavity surface, and the first electrode can be in electrical contact with shaft surface and the second electrode can be in electrical contact with the cavity surface. And if a piezoelectric material element exhibits a non-zero $d_{36}$ shear piezoelectric coefficient, then the element can be polarized in a direction that is parallel to the head and tail surfaces and extends from one of the face surfaces to the opposing face surface, and the first electrode can be in electrical contact with one of the pair of face surfaces and the second electrode can be in electrical contact with the other face surface.

It is appreciated that the electrodes are used to apply an electric field to each of the elements, the electric field being in a direction extending from one electrode surface to the other electrode surface. It is also appreciated that the piezoelectric material elements can be made from several smaller pieces of piezoelectric material and electroded similarly as described above. It is still further appreciated that the head mass and/or the tail mass can be a radiating face for the transducer, the radiating face being the surface, face, body, etc. that can be displaced to provide or accept mechanical energy (e.g. acoustic waves). In addition, the piezoelectric material elements can accept or provide a first form of energy (e.g. electrical energy such as an electric field) and provide or accept, respectively, a second form of energy (e.g. mechanical energy such as sound waves). Stated differently, the piezoelectric material elements, and thus the transducer, have transduction properties and can convert electrical energy into mechanical energy, and vice versa. As such, the transducer can be a generator or a sensor.

In some instances, polarization of a piezoelectric material element can be in a [011] direction of a PMN-PT material and/or have an mm2 macrosymmetry. As such, the PMN-PT material can be a <011> poled PMN-PT solid solution, however it is important to note that the <011> poled PMN-PT may have a zxt ±45° cut (i.e. rotation around the z axis ±45°) in order to obtain a non-zero $d_{3y}$ shear piezoelectric coefficient as taught by Han in U.S. Patent Application Publication No. 2007/0290579. In addition, if the elements have a non-zero $d_{36}$ coefficient, then an electrical bias can be applied to the such that depolarization is prevented.

Turning now to FIG. 1, an embodiment of an electroacoustic transducer is shown generally at reference numeral 10. The transducer 10 can include a tail mass 100, a head mass 200 and at least two parallelepiped shaped piezoelectric material elements 300. The tail mass 100 has a first end 110, a second end 120 and a cavity 130 extending from the first end 110 towards the second end 120. In some instances, the cavity 130 extends from the first end 110 to a location spaced apart from the second end 120, has a cavity wall 132 and a bottom surface 134.

Located at least partially within the cavity 130 of the tail mass 100 is the head mass 200. The head mass 200 can have a head 210 and a shaft 220. The shaft 220 can be attached to and extend from the head 210. The shaft 220 can be integral with the head 210 or in the alternative, be removably attachable to the head 210. It is appreciated that while the head 210 is in the form of a funnel shape in the figures, other shapes can be used and fall within the scope of the present invention, illustratively including a fat disc shape, a parallelepiped shape and the like.

Viewing FIGS. 1-4, disposed between the shaft 220 and the cavity wall 132 are at least two parallelepiped shaped piezoelectric material elements 300. The piezoelectric material elements 300 can have a shaft surface 310 that is adjacent to the shaft 220, an oppositely disposed cavity surface 320 that is adjacent to the cavity wall 132, a head surface 330 that is proximate to and faces the head 210 of the head mass 200 and an oppositely disposed tail surface 340. In addition, the piezoelectric material elements 300 have a pair of oppositely disposed face surfaces 350 that extend between the shaft surface 310 and the cavity surface 320 and between the head surface 330 and the tail surface 340. As shown in the figures, the shaft surfaces 310 and the cavity surfaces 320 can be attached to the shaft 220 and the cavity wall 132, respectively, using an adhesive 302.

A first electrode 351 can be electrically connected to one of the face surfaces 350 while a second electrode 352 is electrically connected to the opposing face surface 350 for a given piezoelectric material element 300. It is appreciated that the first and second electrodes 351 and 352, respectively, can be connected to an electrical energy source. In this manner, an applied electric field can be applied to the elements 300, the electric field being in a direction that is parallel to the head surface 330 and extends from one of the face surfaces 350 to the opposing face surface. As noted earlier, the elements 300 can be polarized in a [011] direction and/or have a mm2 macrosymmetry. In such an instance, the application of the applied electric field from one face surface 350 to an opposing face surface 350 results in mechanical movement of the element 300 in a direction along a shaft axis 201 of the shaft 220. In this manner, movement of the piezoelectric material elements 300 results in movement of the head mass 200. In particular, when an electric field is applied to the piezoelectric material elements 300 in an appropriate manner, vibration of the head 210 is afforded. It is appreciated that those skilled in the art can apply an electric field to the elements 300 such that the electric energy is converted to sound energy and vice versa. It is further appreciated that the head mass 200 can in fact be a tail mass and that the tail mass 100 can be a head mass. Stated differently, the head mass 200 serve as the tail mass, and when the electric field is applied to the piezoelectric material elements 300, vibration of the tail mass 100, now serving as the head mass, is afforded. It is still yet further appreciated that if the head mass serves as a tail mass, and vice versa, that the head mass can have a mass that is generally equal to a mass of the tail mass, at least 2 times greater than the mass of the tail mass, at least 5 times greater than the tail mass, at least 10 times greater than the tail mass or at least 20 times greater than the tail mass.

In some instances, the transducer 10 can be a shear mode projector utilizing a lead magnesium niobate-lead titanate (PMN-PT) single crystal. Such a transducer can use the shear mode properties of a <011> poled PMN-PT single crystal to generate large displacements and reduce the size of the transducer. The <011> poled PMN-PT single crystal has a coupling coefficient $k_{36}$ of approximately 0.8 which affords for significant usable bandwidth in the transducer and allows the electric field to be applied to the material in the same direction as the poling as illustrated in FIGS. 1-4. Therefore, this feature simplifies device construction and allows a bias field to reinforce the polarization of the PMN-PT piezoelectric material.

The shear modulus of the <011> poled PMN-PT single crystal is also much lower than traditional piezoelectric materials, thereby affording a compact acoustic source design. For example, the shear mode compliance of a PMN-PT single crystal material is $s_{66}^{E}=192$ square meters per Newton ($m^2/N$) while traditional piezoelectric materials such as PZT-8 have a $s_{33}^{E}=13.5\ m^2/N$. It is appreciated that the length reduction of a motor section for a piezoelectric motor can be estimated by taking the square root of the ratio of these two values. Therefore, the PMN-PT single crystal shear mode transducer motor section should be approximately four times shorter than an equivalent transducer using PZT-8 material in the longitudinal mode.

Figure 5:
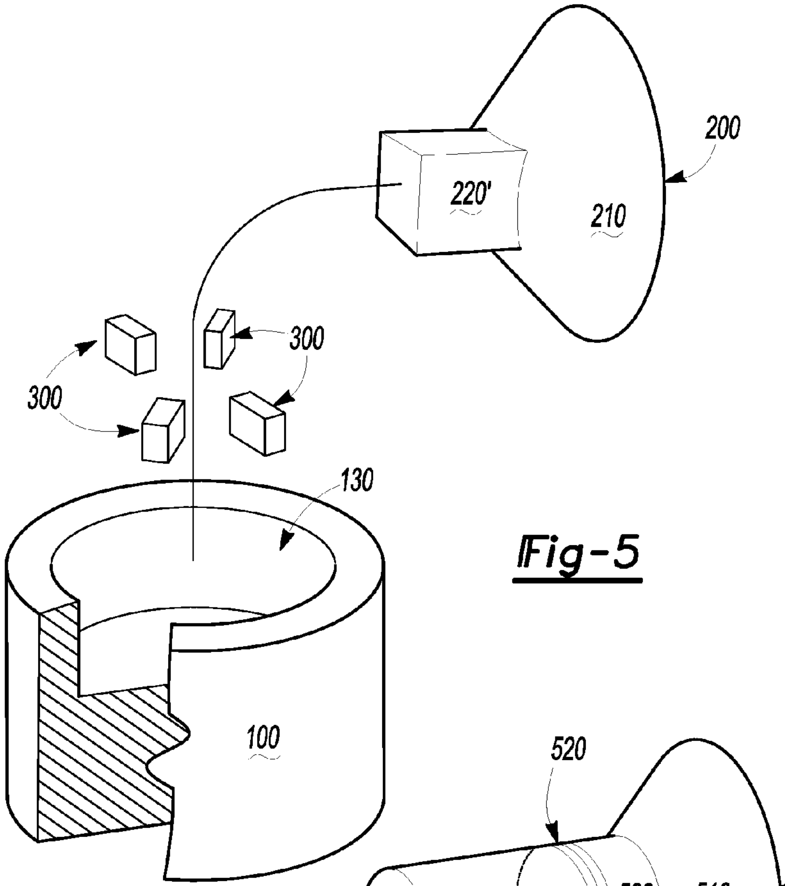
FIG. 5 is another embodiment of the present invention.

Turning to FIG. 5, wherein like reference numerals correspond to like elements described in the previous figures, a shaft 220' is illustrated to have a generally square cross section. As such, it is appreciated that the shape of the head mass 200 and/or the tail mass 100 can be varied so long as the shaft of the head mass is located at least partially within the tail mass and the piezoelectric material elements are disposed therebetween. Thus the cavity 130 can have a circular cross section, a rectangular cross section, a square cross section and the like and the shaft can have similar shaped cross sections. In addition, the tail mass 100 and/or head mass 200 can be made from one or more individual pieces. For example and for illustrative purposes only, the tail mass 100 can be made from separate bodies that are attached to each other and the piezoelectric elements 300, or in the alternative, are attached to the piezoelectric material elements 300 and yet are not attached to each other. Likewise, the head mass 200 can be made from separate bodies that screw together or are attached together using adhesives, threaded fasteners, clips and the like. It is further appreciated that the cavity 130 can extend from the first end 110 completely through the body to the second end 120 and thus does not have to terminate at a location spaced apart from the second end 120. However, if the cavity 130 does terminate at a location spaced apart from the second end 120, then the shaft 220 terminates at a height 'h' from the bottom surface 134 of the cavity 130 such that vibration of the head mass 200 is not interfered with during operation of the transducer.

Figure 6:
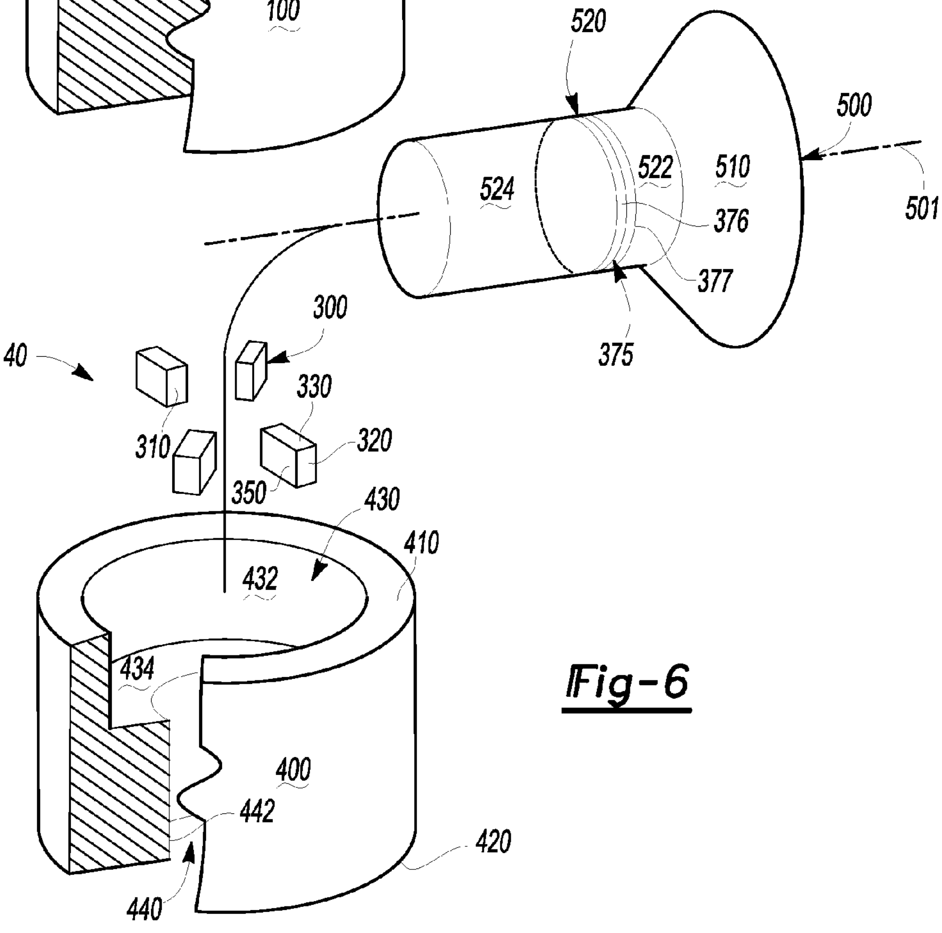
FIG. 6 is an exploded view of yet another embodiment of the present invention.
Figure 7:
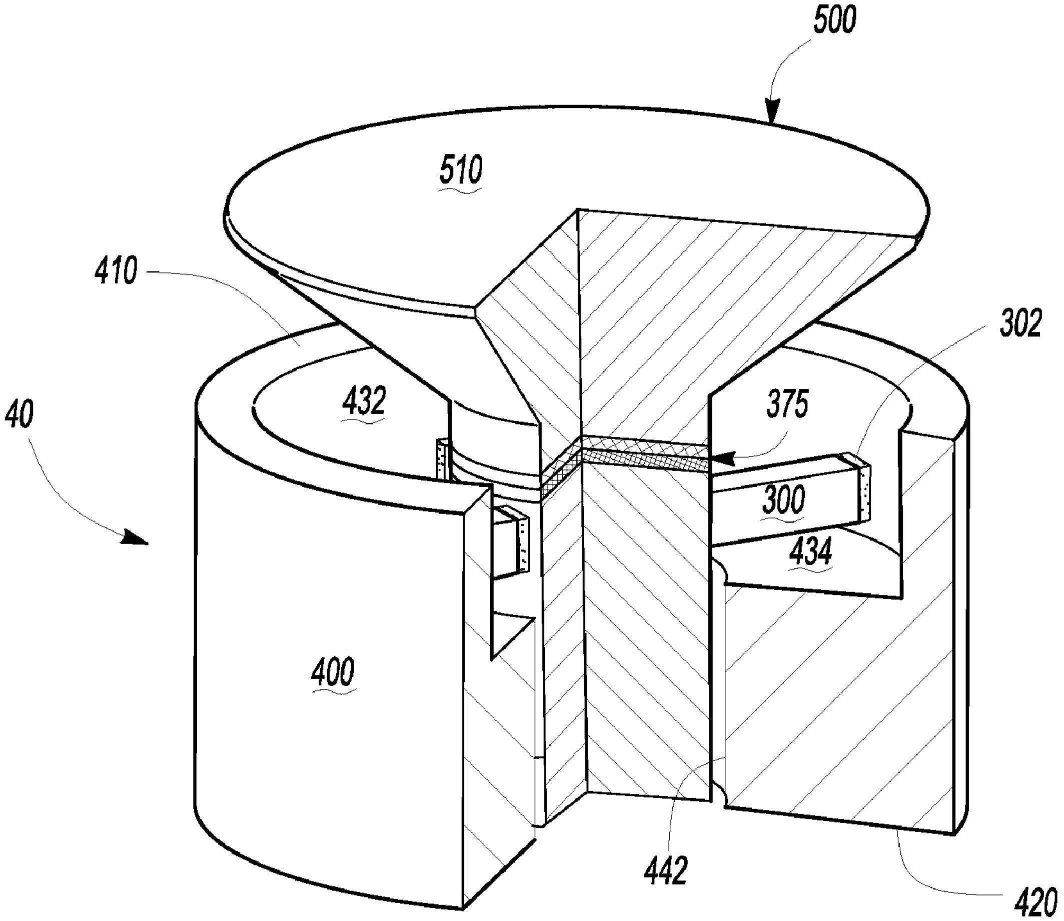
FIG. 7 is a partial cutaway view of the embodiment shown in FIG. 6.

Turning now to FIGS. 6 and 7, another embodiment is shown generally at reference numeral 40. The transducer 40 takes advantage of the piezoelectric material elements 300 and an active material element 375. The piezoelectric material elements 300 have been described above. The active material element 375 is located at least partially within a shaft 520 of a head mass 500 and can be disposed between and attached to a first portion 522 and a second portion 524 of the shaft 520. In addition, the active material element 375 can have an outer surface 376 that is complimentary with an outer surface of the shaft 520, though this is not required, and the element 375 can be made from a piezoelectric material, a magnetostrictive material or an electrostrictive material. It is appreciated that the active material element 375 has opposing face surfaces 377 to which electrodes can be electrically connected. Therefore, an electric field can be applied in a direction from one face 377 to the opposing face. The application of the electric field results in mechanical movement of the active material element 375 in a direction along a shaft axis 501 of the shaft 520. As such, the piezoelectric material elements 300 can be selected for a particular bandwidth while the active material element 375 can be selected for a different bandwidth and thereby provide an expandable usable bandwidth for the transducer 40. For example, the piezoelectric material elements 300 can have a usable bandwidth of between 2-10 kilohertz while the active material element 375 can have a usable bandwidth of between 10-30 kilohertz. In this manner, the transducer 40 can have a usable bandwidth in the range from 2-30 kilohertz.

In some instances, the transducer 10 and transducer 40 can represent sonar transducers made from piezoelectric materials. Existing low frequency sonar transducers, e.g. sonar transducers having a frequency range of less than approximately 5-10 kilohertz, show significant degradation in performance as hydrostatic pressure is increased. For example, at a water level/depth of 200 meters, the transmit sensitivity (TVR) decreases by 3-5 decibels over much of a current tranducer's operating frequencies. As such, at a depth of 500 meters, such a transducer can cease to function. In contrast, transducers such as those illustrated and taught above can be supported from the head mass 200 via a vibration isolation mount which isolates the PMN-PT single crystal piezoelectric material from hydrostatic pressure. In this manner, such a transducer would vary by less than 1 decibel at depths up to 500 meters.

Although PMN-PT piezoelectric single crystals have been discussed for the above embodiments, this has been for illustrative purposes only and does not limit the present invention from using other piezoelectric materials. The foregoing drawings, discussion and descriptions are illustrative of specific embodiments of the present invention, but they are not meant to be limitations upon the practice thereof. Numerous modifications and variations of the invention will be readily apparent to those of skill in the art in view of the teaching presented herein. It is the following claims, including all equivalents, which define the scope of the invention.

We claim:

1. An electroacoustic transducer comprising:

a tail mass having a body extending between a first end and a second end, said body having a cavity with a cavity wall, said cavity extending from said first end towards said second end;

a head mass having a head and an elongated shaft attached to and extending from said head, said shaft having a shaft axis and being located at least partially within said cavity of said tail mass;

a radiating face, said radiating face being said head mass;

at least two parallelepiped shaped piezoelectric material elements disposed between and attached to said shaft and said head mass, each of said elements being made from a piezoelectric material having a non-zero $d_{3y}$ shear piezoelectric coefficient, said $d_{3y}$ shear piezoelectric coefficient selected from the group consisting of $d_{34}$, $d_{35}$ and $d_{36}$;

said elements each having a shaft surface adjacent said shaft, an oppositely disposed cavity surface adjacent said cavity wall, a head surface proximate to and facing said head of said head mass and an oppositely disposed tail surface, and a pair of oppositely disposed face surfaces that extend between said shaft surface to said cavity surface and said head surface to said tail surface; and a first electrode in electrical contact with one of said element surfaces and a second electrode in electrical contact with one of said element surfaces that is oppositely disposed from said first electrode, said first and second electrodes operable to apply an electric field therebetween.

2. The electroacoustic transducer of claim 1, wherein said elements have a non-zero $d_{3y}$ shear piezoelectric coefficient, said $d_{3y}$ shear piezoelectric coefficient selected from the group consisting of $d_{34}$ and $d_{35}$, with each element polarized in a direction that is parallel to said shaft and cavity surfaces and extends from said head surface to said tail surface.

3. The electroacoustic transducer of claim 2, wherein said first electrode is in electrical contact with said head surface and said second electrode is in electrical contact with said tail surface, said first and second electrodes operable to apply the electric field between said head surface and said tail surface.

4. The electroacoustic transducer of claim 1, wherein said elements have a non-zero $d_{3y}$ shear piezoelectric coefficient, said $d_{3y}$ shear piezoelectric coefficient selected from the group consisting of $d_{34}$ and $d_{35}$, with each element polarized in a direction that is parallel to said head and tail surfaces and extends from said shaft surface to said cavity surface.

5. The electroacoustic transducer of claim 4, wherein said first electrode is in electrical contact with said shaft surface and said second electrode is in electrical contact with said cavity surface of each of said elements, said first and second electrodes operable to apply the electric field between said shaft surface and said cavity surface.

6. The electroacoustic transducer of claim 1, wherein said elements have a non-zero $d_{36}$ shear piezoelectric coefficient and each are polarized in a direction that is parallel to said head surface and extends from one of said pair of face surfaces to the other of said pair of face surfaces.

7. The electroacoustic transducer of claim 6, wherein said first electrode is in electrical contact with one of said pair of face surfaces and said second electrode is in electrical contact with the other of said pair of face surfaces of each of said elements, said first and second electrodes operable to apply the electric field between said opposing face surfaces.

8. The electroacoustic transducer of claim 1, further comprising at least one shaft active material element disposed between and attached to a first portion and a second portion of said shaft, said at least one shaft active material element selected from the group consisting of a piezoelectric material, a magnetostrictive material and an electrostrictive material.

9. An electroacoustic transducer comprising:

a tail mass having a body extending between a first end and a second end, said body having a cavity with a cavity wall, said cavity extending from said first end towards said second end;

a head mass having a head and an elongated shaft attached to and extending from said head, said shaft having a shaft axis and being located at least partially within said cavity of said tail mass;

a radiating face, said radiating face being said tail mass;

at least two parallelepiped shaped piezoelectric material elements disposed between and attached to said shaft and said head mass, each of said elements being made from a piezoelectric material having a non-zero $d_{3y}$ shear piezoelectric coefficient, said $d_{3y}$ shear piezoelectric coefficient selected from the group consisting of $d_{34}$, $d_{35}$ and $d_{36}$;

said elements each having a shaft surface adjacent said shaft, an oppositely disposed cavity surface adjacent said cavity wall, a head surface proximate to and facing said head of said head mass and an oppositely disposed tail surface, and a pair of oppositely disposed face surfaces that extend between said shaft surface to said cavity surface and said head surface to said tail surface; and a first electrode in electrical contact with one of said element surfaces and a second electrode in electrical contact with one of said element surfaces that is oppositely disposed from said first electrode, said first and second electrodes operable to apply an electric field therebetween.

10. The electroacoustic transducer of claim 9, wherein said elements have a non-zero $d_{3y}$ shear piezoelectric coefficient, said $d_{3y}$ shear piezoelectric coefficient selected from the group consisting of $d_{34}$ and $d_{35}$, with each element polarized in a direction that is parallel to said shaft and cavity surfaces and extends from said head surface to said tail surface.

11. The electroacoustic transducer of claim 10, wherein said first electrode is in electrical contact with said head surface and said second electrode is in electrical contact with said tail surface, said first and second electrodes operable to apply the electric field between said head surface and said tail surface.

12. The electroacoustic transducer of claim 9, wherein said elements have a non-zero $d_{3y}$ shear piezoelectric coefficient, said $d_{3y}$ shear piezoelectric coefficient selected from the group consisting of $d_{34}$ and $d_{35}$, with each element polarized in a direction that is parallel to said head and tail surfaces and extends from said shaft surface to said cavity surface.

13. The electroacoustic transducer of claim 12, wherein said first electrode is in electrical contact with said shaft surface and said second electrode is in electrical contact with said cavity surface of each of said elements, said first and second electrodes operable to apply the electric field between said shaft surface and said cavity surface.

14. The electroacoustic transducer of claim 9, wherein said elements have a non-zero $d_{36}$ shear piezoelectric coefficient and each are polarized in a direction that is parallel to said head surface and extends from one of said pair of face surfaces to the other of said pair of face surfaces.

15. The electroacoustic transducer of claim 14, wherein said first electrode is in electrical contact with one of said pair of face surfaces and said second electrode is in electrical contact with the other of said pair of face surfaces of each of said elements, said first and second electrodes operable to apply the electric field between said opposing face surfaces.

16. The electroacoustic transducer of claim 9, further comprising at least one shaft active material element disposed between and attached to a first portion and a second portion of said shaft, said at least one shaft active material element selected from the group consisting of a piezoelectric material, a magnetostrictive material and an electrostrictive material.

17. A process for operating an electroacoustic transducer, the process comprising: providing an electroacoustic transducer, the electroacoustic transducer having:

a tail mass with a body extending between a first end and a second end, the body having a cavity with a cavity wall extending from the first end towards the second end;

a head mass with a head and an elongated shaft attached to and extending from the head, the shaft having a shaft axis and being located at least partially within the cavity of the tail mass;

at least two parallelepiped shaped piezoelectric material elements disposed between and attached to the shaft and the head mass, each of the elements being made from a piezoelectric material having a non-zero $d_{3y}$ shear piezoelectric coefficient, the $d_{3y}$ coefficient selected from the group consisting of $d_{34}$, $d_{35}$ and $d_{36}$;

the elements each having a shaft surface adjacent the shaft, an oppositely disposed cavity surface adjacent the cavity wall, a head surface proximate to and facing the head of the head mass and an oppositely disposed tail surface, and a pair of oppositely disposed face surfaces that extend between the shaft surface to the cavity surface and the head surface to the tail surface;

the elements also having been polarized in a direction that is parallel to the head surface and extends from one of the pair of face surfaces to the other of the pair of face surfaces;

a first electrode in electrical contact with one of said element surfaces and a second electrode in electrical contact with one of said element surfaces that is oppositely disposed from said first electrode; and each of said elements accepting energy in a first form and providing energy in a second form.

18. The process of claim 17, wherein said first form of energy is an electric field and said second form of energy is a mechanical displacement of said elements.

19. The process of claim 17, wherein said first form of energy is a mechanical displacement of said elements and said second form of energy is an electric field.

20. The process for operating an electroacoustic transducer of claim 18, further including applying an electrical bias to each of the elements for the purpose of preventing depolarization of the at least two piezoelectric material elements.

* * * * *